United States Patent [19]
Clemens et al.

[11] Patent Number: 6,038,163
[45] Date of Patent: Mar. 14, 2000

[54] CAPACITOR LOADED MEMORY CELL

[75] Inventors: James T. Clemens, Watchung; Philip W. Diodato, Asbury; Yiu-Huen Wong, Summit, all of N.J.

[73] Assignee: Lucent Technologies Inc., Murray Hill, N.J.

[21] Appl. No.: 09/189,131

[22] Filed: Nov. 9, 1998

[51] Int. Cl.⁷ .................................................. G11C 11/00
[52] U.S. Cl. ........................ 365/154; 365/218; 365/149; 365/188
[58] Field of Search ........................... 257/298; 365/154, 365/153, 149, 180, 161, 218, 188

[56] References Cited

U.S. PATENT DOCUMENTS

| | | | |
|---|---|---|---|
| 5,283,500 | 2/1994 | Kochanski | 315/58 |
| 5,485,420 | 1/1996 | Lage et al. | 365/154 |
| 5,576,240 | 11/1996 | Radosevich et al. | 437/60 |
| 5,696,394 | 12/1997 | Jones, Jr. et al. | 257/295 |
| 5,739,564 | 4/1998 | Kasa et al. | 257/298 |
| 5,825,684 | 10/1998 | Lee | 365/154 |

OTHER PUBLICATIONS

"A 2.9 $\mu m^2$ Embedded SRAM Cell with Co–Salicide Direct Strap Technology for 0.18 $\mu m$ mHigh Performance CMOS Logic," by K. Noda, K. Matsui, K. Inoue, T. Itani, H. Iwasaki, K. Urabe, H. Miyamoto, K. Tokashiki, H. Kawamoto, M. Satoh, K. yoshida, K. Kishimoto, K. Koyanagi, T. Tanigawa, *ICDM Digest of Tech papers*, Dec. 1987.

Article Untitled, by P. W. Diodato, J. T. Clemens, W. W. Troutman, W. S. Lindenberger, *CICC Digest of Tech Papers*, May 1997.

*Primary Examiner*—David Nelms
*Assistant Examiner*—Thong Le

[57] ABSTRACT

An apparatus and method for constructing a capacitor loaded memory cell. This capacitor loaded memory cell operates as a static random access memory (SRAM) cell if a particular capacitor and transistor configuration is used. Normally, capacitors are not an obvious choice as a load device for a memory cell because the intrinsic nature of capacitors is one that blocks the flow of direct current, the invention takes into account the secondary effects such as leakage of a particular dielectric used in the construction of the capacitor to modify the current blocking nature of the capacitor.

18 Claims, 6 Drawing Sheets

CAPACITOR LOADED MEMORY CELL

BACKGROUND OF THE INVENTION

1. Field of the Invention

The present invention generally relates to an apparatus and method for constructing a memory cell using capacitors as load elements. The capacitor loaded memory cell of the present invention operates as a static random access memory (SRAM) cell when a particular capacitor/transistor connection is chosen.

2. Description of Related Art

As is well known in the art, there are basically two types of metal oxide semiconductor (MOS) random access memories (RAMS): static and dynamic. A static RAM or SRAM is a form of semiconductor memory based on the logic circuit known as a flip-flop, which retains information as long as there is enough power to operate the device. These flip-flops have to be simple in order to minimize the silicon area per cell, which is very important since the cell array constitutes by far the largest part of the memory chip. The problem with standard SRAMS is their large size, owing to the use of six transistors in each memory cell where all six are aligned in one plane of the silicon wafer containing them.

Dynamic RAMS (DRAMS) on the other hand store binary data on capacitors resulting in a further reduction in a cell area at the expense of a more elaborate read/write circuitry. The binary data stored in DRAMs is in the form of the charge on the capacitor.

Due to various leakage effects (i.e., current drain) that are inevitably present, the capacitor charge will eventually leak off. Thus, to insure proper operation of DRAMs, a refresh operation must be completed periodically. During the refresh operation, the memory cells' content is read and the data stored therein is rewritten, thus restoring the capacitor charge to its proper value. The refresh operation must be performed every few milliseconds (eg. eight to sixteen milliseconds) and thus implies the necessity of having a clock connection to the DRAM circuit. This periodic refresh operation required in the DRAMs operation requires that additional refresh circuitry must be included in the design thereby increasing the surface area of the circuit.

Nevertheless, since the DRAM memory cell has such few components and the DRAM cells are smaller, the DRAMs achieve greater packing density than is possible with any static RAM. Despite being slower, DRAMs are more commonly used than SRAMs because of the smaller DRAM cell design that allows a DRAM to hold up to four times as much data as a SRAM within the same surface area on the integrated circuit.

Heretofore, SRAMs and DRAMs have not fulfilled the desiderate of providing a memory cell with materially reduced circuit complexity and a high speed of access.

SUMMARY OF THE INVENTION

Certain objects, advantages and novel features of the invention will be set forth in part in the description that follows and in part will become apparent to those skilled in the art upon examination of the following or may be learned with the practice of the invention. The objects, features, and advantages of the invention may be realized and obtained by means of the instrumentalities and combinations particularly pointed out in the appended claims.

Normally, capacitors are not obvious load elements in an SRAM cell, because the intrinsic nature of a capacitor blocks (or prevents) the high voltage of the power supply from reaching the transistor elements of the SRAM cell (see Essentials of Radio-Electronics, $2^{nd}$ edition, Slurzberg and Osterheld, McGraw-Hill, page 173). The present invention takes into account the secondary effect of leakage (i.e., current drain) of particular dielectrics, used in the construction of the capacitor, to modify its current blocking nature. This modification allows a sufficient amount of current to flow into the memory cell, so that a positive feedback is guaranteed and static operation is insured.

To achieve the advantages and novel features, the present invention is generally directed to the utilization of a capacitor as a load element in a memory cell. In the context of the present invention, "load element" is used to indicate that current is passed through the capacitor to the transistor. In one embodiment of the present invention, a capacitor loaded memory circuit utilizes two capacitors to obtain offset current paths through two analogous parasitic resistors of sufficient magnitude to offset other leakage currents from the four transistors of the memory cell. This offset current, along with a particular capacitor/transistor interconnection, will regulate the logic levels in the memory cells to settle the memory cells into a static state.

The apparatus and method of the present invention of a capacitor load memory circuit takes advantage of the controlled current leakage (i.e., current drain) to the power supply. The current leakage can be controlled utilizing any one of the different methods including, but not limited to, the type of dielectric material used, the surface area of the designed capacitor, or the actual thickness of the dielectric material.

In the preferred embodiment, the apparatus and method for the capacitor load memory circuit further includes the use of $Ta_2O_5$ (tantalum pentoxide), $TiO_2$ (titanium dioxide), or other capacitor dielectrics to enhance the designed current leakage to the power supply. Current-voltage characteristics of a $Ta_2O_5$ or $TiO_2$ capacitor (and other dielectrics with a dielectric constant greater than about 10) are controllable by designing the optimum surface area of the designed capacitor, or the actual thickness of the dielectric material. A $Ta_2O_5$ or $TiO_2$ capacitor (and other dielectrics with a dielectric constant greater than about 10) can operate at almost any current level that can be achieved in a reproducible manner. This is because the capacitor-dielectrics have a controlled time and frequency dependent impedance. This controlled time and frequency dependent impedance: 1) compensates for deleterious and slow to change leakage mechanisms found in all circuits, and 2) stabilizes the circuit against the high frequency or transient events (i.e alpha particles, ground bounce of the power supply, and the like) that tend to upset circuits such as memories.

In the preferred embodiment of the present invention, the controlled current leakage (i.e., current drain) of the capacitor is about ten times that of the current leakage (i.e., current drain) of the transistor used. The controlled current leakage the capacitor of about ten times that of the current leakage of the transistor is used to optimize the circuit. However, capacitors utilizing a current leakage range of five (5) times to twenty (20) times the current leakage of the transistor can be successfully used in the circuit. This current leakage measurement of the transistor used is determined when the transistor is in an off condition (i.e., $I_{off}$).

BRIEF DESCRIPTION OF THE DRAWINGS

The accompanying drawings incorporated in and forming a part of the specification illustrate several aspects of the present invention, and together with the description, serve to explain the principles of the invention. In the drawings.

DETAILED DESCRIPTION OF THE PREFERRED EMBODIMENT

Figure 1:
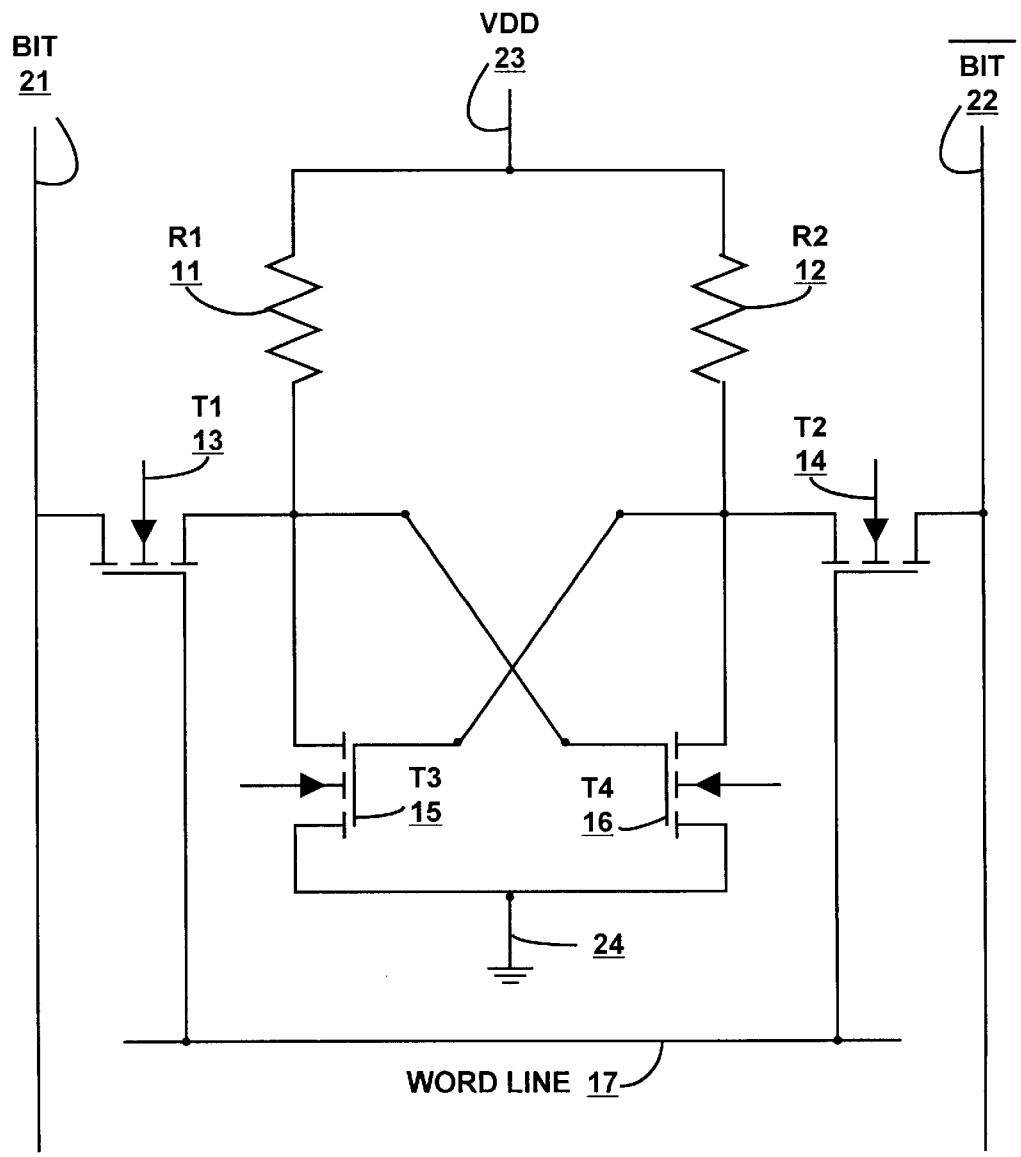
FIG. 1 is a schematic of a typical prior art 4 (four) transistor and 2 (two) load resistor static RAM cell circuit.

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims.

Figure 2:
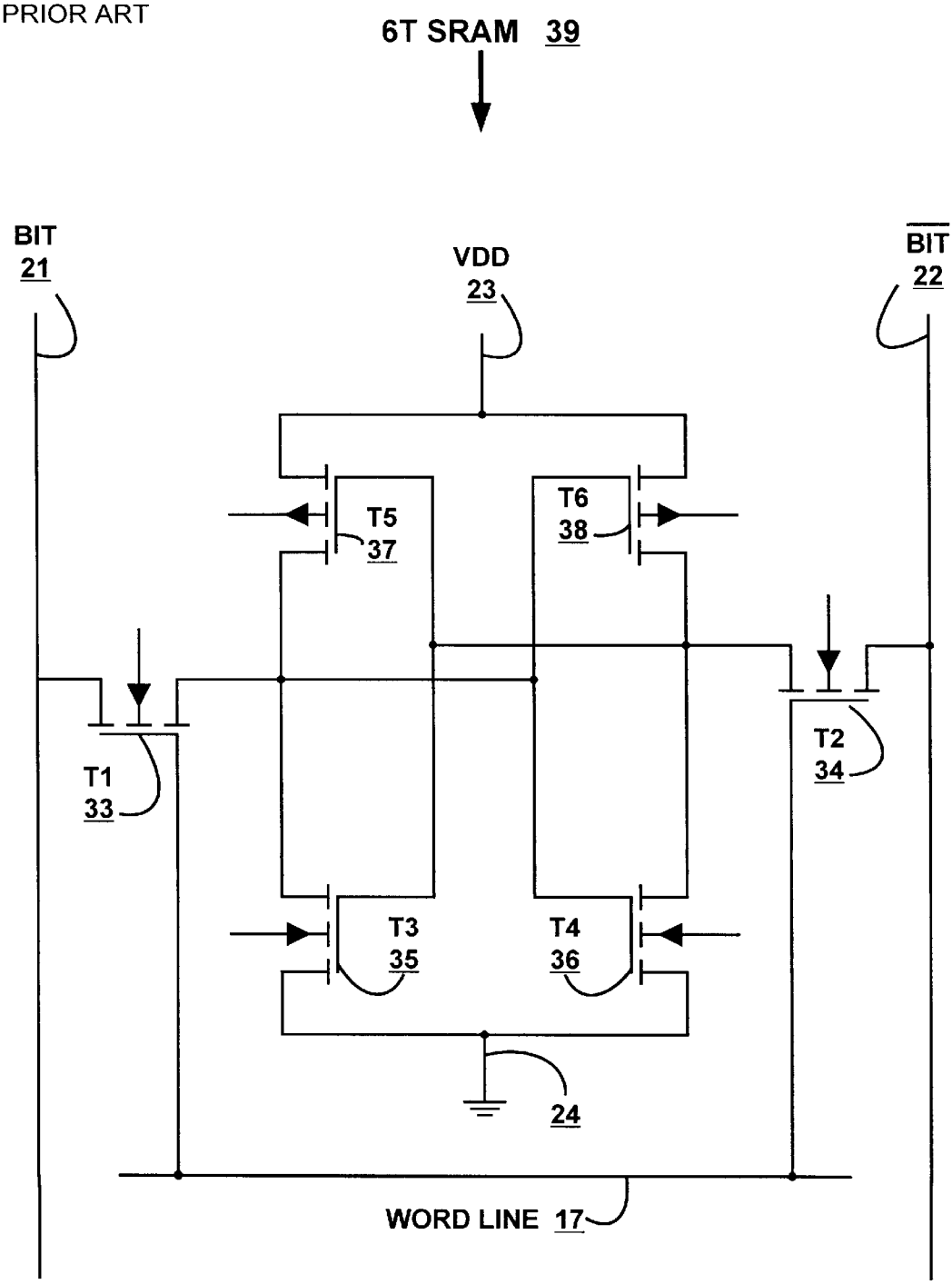
FIG. 2 shows a schematic of a typical prior art 6 (six) transistor static CMOS RAM cell circuit.

Illustrated in FIGS. 1 and 2, are typical static RAM cells utilizing MOS technology. Each of the cells shown in FIGS. 1 and 2 consist of a flip-flop, formed by the cross coupling of two inverter transistors T3 and T4 (items 15, 16, 35 and 36 in FIGS. 1 & 2 respectively), and two access transistors T1 and T2 (items 13, 14, 33 and 34 in FIGS. 1 & 2 respectively). The access transistors T1 and T2 are turned on when the word line 17 is selected (i.e., raised in voltage) and the access transistors are connected to the flip-flop and connect the flip-flop to the column BIT line 21 and $\overline{BIT}$ 22. The access transistors T1 and T2 act as transmission gates that control bi-directional current flow between the flip-flops and the BIT line 21 and $\overline{BIT}$ line 22. In FIG. 1, the 4T/2R SRAM 19 utilizes load resistors R1 11 and R2 12 that are formed in a polysilicon layer via an additional processing step. These large valued resistors can be fabricated in such a way that the result is low power dissipation per cell.

Access to the SRAM memory cells 19 and 39 in FIGS. 1 and 2 respectively, is realized where the voltage of the word line 17 is raised thus turning on transistors T1 and T2 (13, 14, 33 and 34). In this way, one side of the cell flipflop is connected to the BIT line and the other sign is connected to the $\overline{BIT}$ line 22.

A read instruction of the SRAM 39 is as follows, assuming that the cell is storing a logic-level zero. In this scenario, transistor T3 (35) is on and T4 (36) is off. Before the read operation begins, the voltage of BIT 21 and $\overline{BIT}$ 22 are precharged to VDD. When transistors T1 33 and T2 34 are turned on, the current flows from the BIT 21 through transistors T1 33 and T3 35 to ground. This causes a drop in the BIT line 21 voltage. Simultaneously, current flows from VDD 23 through transistors T6 38 and T4 36 and on to the BIT line 21, causing an small decrease in BIT line 21 voltage. The voltage signal that appears between the BIT 21 and $\overline{BIT}$ 22 lines is then fed into a column sense amplifier (not shown). Only the sense amplifier in the selected column will be active and its output is connected to the data output line of the chip.

In a write operation, the data BIT to be written and its complement are transferred to the BIT 21 and $\overline{BIT}$ 22 lines respectively. Thus, if a logic-level one is written, the BIT line 21 is raised to VDD 23 and the $\overline{BIT}$ 22 line is lowered to ground. The conducting transistors T1 33 and T2 34 then cause the high voltage to appear at the gate of transistor T4 36 and a low voltage to appear at the gate of transistor T3 35. The flip-flop is then forced into a state in which the drain of transistor T3 35 is high and that of transistor T4 36 is low. This state, which denotes a stored logic-level one, will remain a logic-level one indefinitely or until changed by another write operation or till power is interrupted.

Static RAMS can keep their contents indefinitely as long as the power supply is connected. While a clock is usually used for gating and synchronization, a clock is not necessary for a memory chip operation in static RAMS. Dynamic RAMs on the other hand do require a clock to control periodic refresh operation.

Figure 3:
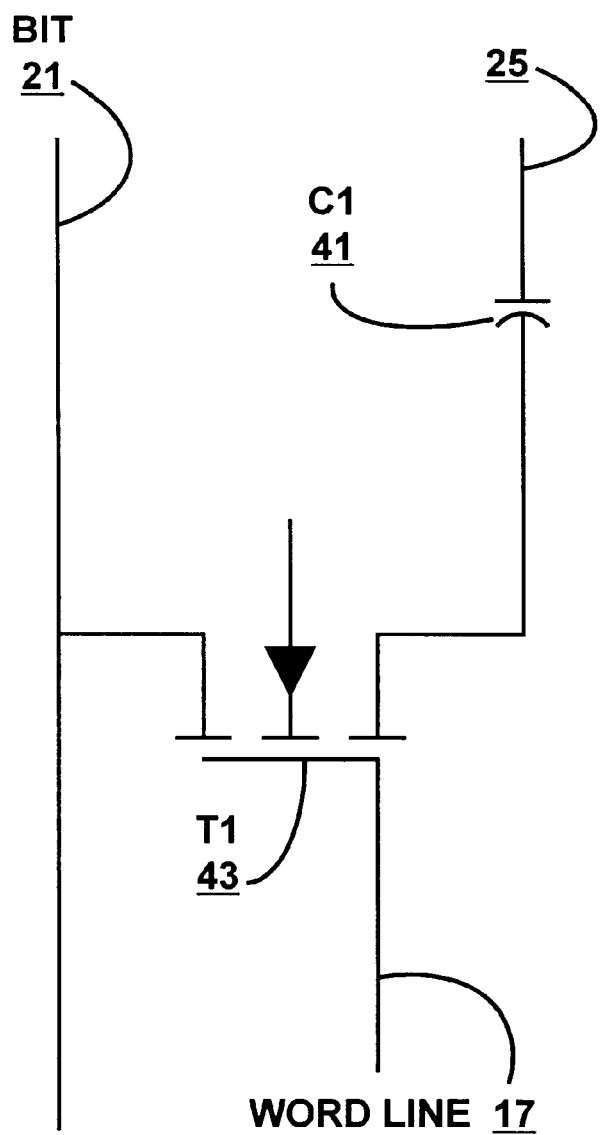
FIG. 3 is diagram of a typical prior art single transistor single capacitor dynamic RAM cell circuit.
Figure 4:
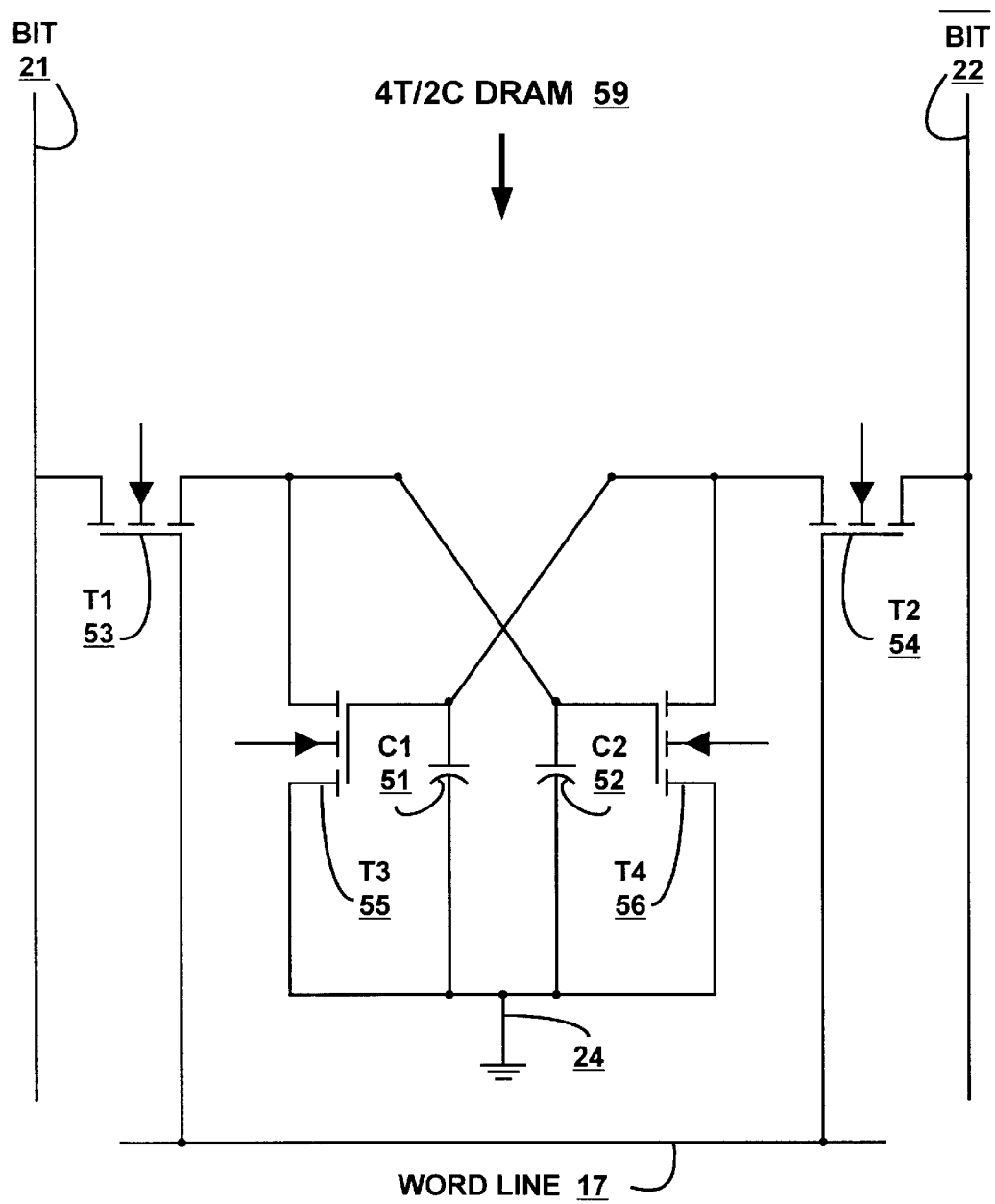
FIG. 4 is a diagram of a typical prior art 4 (four) transistor and 2 (two) capacitor dynamic RAM cell circuit.

Illustrated in FIGS. 3 and 4, are typical memory cells utilizing Dynamic RAM (DRAM) configuration. DRAMS store information in integrated circuits by utilizing capacitors. A logic zero is represented by a voltage close to zero. A logic level one is represented by a capacitor voltage of a value closer to the power supply VDD 23.

Because, as noted above, capacitors in the DRAM memory loose their charge over time, DRAM memory must include logic to refresh (i.e., recharge) the DRAM circuits continuously. During the refresh, the cells content is read and the BIT data is rewritten, thus restoring the capacitor voltage to its proper value. However, while a DRAM is being refreshed, it cannot be read by a micro-processor. Thus, if a micro-processor must read the DRAM while it is being refreshed, the microprocessor must wait one or more wait states until the read operation is completed.

A refresh operation must be performed frequently (e.g. every eight to sixteen milliseconds). The need for periodic refreshing of a dynamic memory chip implies a necessity of having a periodic refresh signal as noted above. The periodic refresh operation necessary in a DRAM, requires additional circuitry that is not shown in the figures.

Illustrated in FIG. 3 is the most common storage cell utilizing Dynamic RAM (DRAM). This cell 49 is appropriately known as a one transistor cell (1T DRAM). The cell consists of a single transistor T1 43, known as the access transistor and a storage capacitor C1 41.

The gate of the transistor T1 43 is connected to the word line 17 and its drain is connected to the BIT 21 line. As in any memory, the row decoder selects a particular row by asserting the voltage of the storage cell word line 17. This causes all the transistors in a selected row to be conductive and thereby connecting the storage capacitors of its cells in the selected row to their respective bit lines.

Thus, the cell capacitor C1 41 is connected to the BIT line 21 as indicated in FIG. 3. Now, if the operation is a read and the cell is storing a logic 1, then the voltage of the capacitor C1 41 will cause a positive increment to appear across BIT line 21. Since BIT 21 is much greater than C, the voltage (or charge) increment on BIT 21 will be much smaller than the initial voltage of C1 41. Obviously, if the cell is storing a logic-level zero, then there will be a negative increment of voltage (or charge) appearing on BIT 21 line (with respect to its initial state).

The change in voltage on the BIT line 21 is detected and amplified by the column sense amplifiers (not shown). The amplified signal is then impressed on the storage capacitor C1 41, thus restoring the signal to the proper level. In this way, all cells on the selected row are refreshed. Simultaneously, the signal at the output of a sense amplifier of the selected column is fed into the data output line of the chip.

The write operation proceeds similarly to the read operation, except that the data bit to be written, which is impressed upon the BIT line 21 is applied to the column decoder (not shown) to the selected BIT line 21. This data BIT is then stored on capacitor C1 41 of the selected cell. Simultaneously, all other cells in the selected row are also written with specific information.

Although read and write operations result in automatic refreshing of the selected row, provisions must be made for periodic refreshing of the entire memory frequently (e.g. every eight to sixteen milliseconds) as specified for a particular integrated circuit. The refresh operation is carried out in burst mode one row at a time. During refresh, the chip normally will not be available for external read or write operations.

Illustrated in FIG. 4 is a four transistor two capacitor DRAM 59 memory cell. In the DRAM 59, gated excitation of each load is supplied by word line 17. The transistors T1 53 and T2 54 act simultaneously as load and row selection transistors. If word line 17 is zero, then transistors T1 53 and T2 54 are off and no information can be written into or read out of the memory cell 59. However, if word line 17 is equal to a logic-level one, then transistors T1 53 and T2 54 are on and the four transistors form a latch which can store a 1 (T1 56 is on) or a zero (T3 55 is on).

As with DRAM 49 in FIG. 3, information in the DRAM 59 cell is stored in the capacitor C1 51 and C2 52 between the gate and the source of transistors T3 55 and T4 56 respectively. If a digital one is stored, then C2 52 is charged with the voltage (VDD–Vth) where Vth is the access transistor threshold voltage, and capacitor C1 51 is charged to a voltage of zero. If the converse is true, the capacitor C2 52 is charged to a voltage of zero and capacitor C1 55 is charged (VDD–Vth).

If, after the data is stored in DRAM 59 cell and is not accessed for some time, the charge on the capacitor decreases because of the inevitable leakage currents. If the time between writing the data and the next access is too long, the logic level one voltage may become small enough to be indistinguishable from the logic level zero, and the information is then lost. The same phenomenon is the reason why dynamic shift registers cannot be operated below a minimum operating frequency. Clearly, some additional circuitry is required to refresh the stored data before the drop in the capacitor voltage C1 51 and C2 52 becomes excessive.

Figure 5:
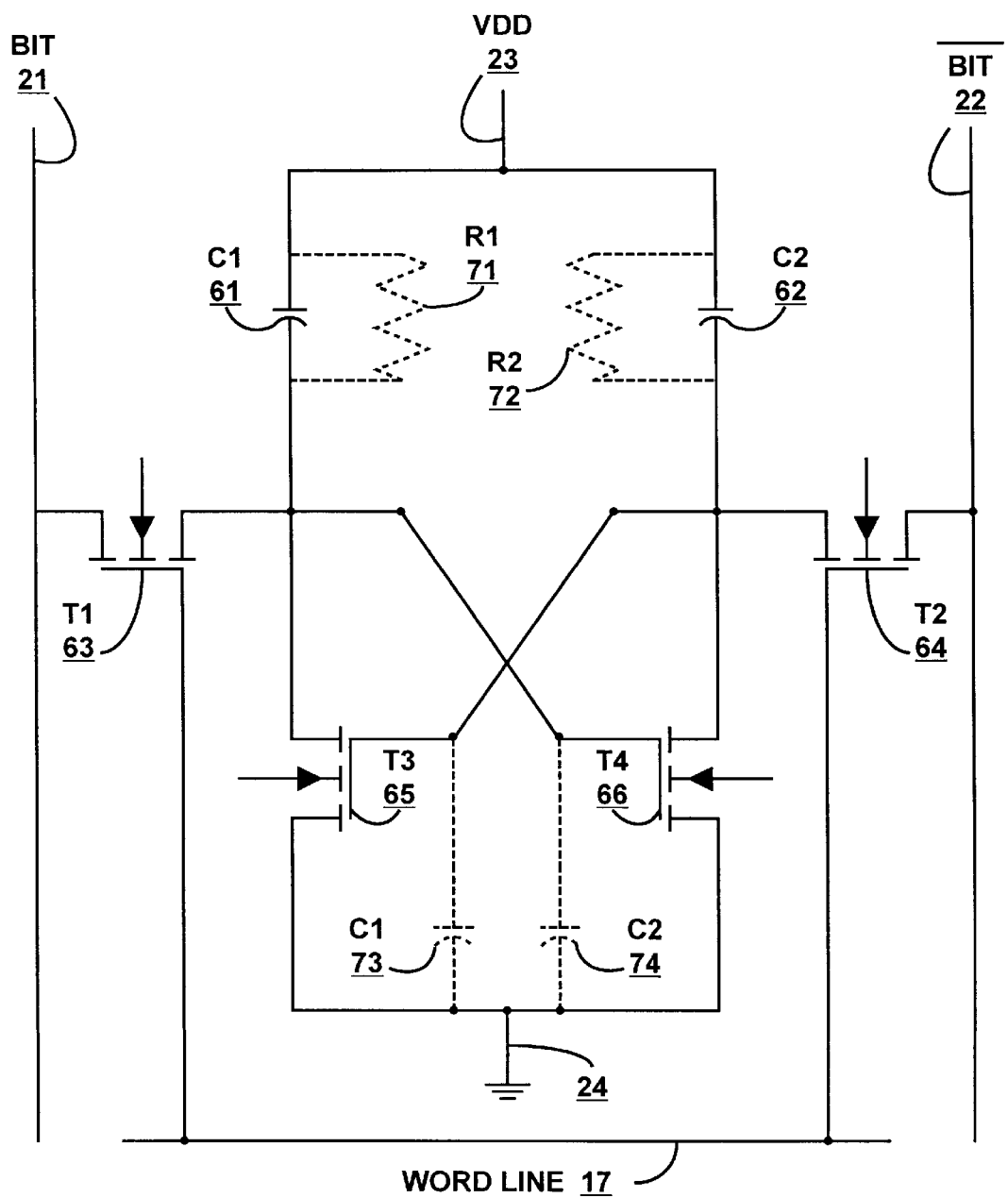
FIG. 5 is a circuit diagram of the 4 (four) transistors and 2 (two) capacitors, with intentional conduction paths through the parasitic resistors, static random access memory cell circuit of the present invention.

Illustrated in FIG. 5 is a 4 transistor 2 capacitor (4T/2C) static random access memory 60 embodying the principles of the present invention. The 4T/2C SRAM 60 includes the parasitic resistance reflected as the current leakage, from R1 71 and R2 72. The 4T/2C SRAM 60 of the present invention also includes a flipflop formed by a cross coupling of two inverters and two access transistors T1 63 and T2 64. The access transistors T1 63 and T2 64 are turned on when the word line 17 is selected (i.e., raised in voltage), and the access transistors T1 63 and T2 64 connect the flipflop to the BIT 21 and $\overline{\text{BIT}}$ 22 lines. It is noted that both BIT 21 and $\overline{\text{BIT}}$ 22 lines are utilized. The access transistors T1 63 and T2 64, act as transmission gates allowing bi-directional current flow between the flipflop and the BIT 21 and $\overline{\text{BIT}}$ 22 lines.

The memory cell of the present invention also utilizes capacitors C1 61 and C2 62, intentional conduction paths for obtaining current through the parasitic resistors R1 71 and R2 72 respectively. These parasitic resistors R1 71 and R2 72 are reflected as the current leakage through the dielectric of capacitors C1 61 and C2 62 respectively, and compensates for any other current leakage from the four transistors T1 63, T2 64, T3 65, and T4 66. This compensation current, along with a particular capacitor/transistor interconnection as shown in FIG. 5 will regulate (i.e. control) the logic levels of the memory cell in such a way that they settle into a stable static state.

A significant aspect of this disclosure is the recognition that capacitor C1 61 and C2 62 can be advantageously used instead of load resistors R1 11 and R2 12 of the prior art (FIG. 1) four (4) transistor two (2) resistor static random access memory cell shown and discussed above with regard to FIG. 1.

As is discussed with more detail hereinafter, substitution of the capacitors for resistors necessitates some design changes. However, the substitution can substantially improve the manufacturability of the capacitor loaded memory cell since it is relatively easy to produce a monolithic capacitor of the required capacitance values on a limited surface area of an integrated circuit, whereas, it is difficult to reproduce manufactured monolithic resistors of the required high resistance on the limited surface area of an integrated circuit.

Furthermore, the use of capacitors controlled time and frequency dependent impedance can result in memory cell designs that are relatively insensitive to temperature variations, since high value resistors typically introduce significant temperature dependencies, whereas capacitors are typically relatively insensitive. This is explained further in commonly assigned U.S. Pat. No. 5,283,500, to Kochanski, entitled "Flat Panel Field Emission Display Apparatus," herein incorporated by reference.

The dielectric of each of the capacitors C1 61 and C2 62 is intentionally leaky, so as to provide effective resistance that corresponds to the load resistors R1 11 and R2 12 of FIG. 1. In the preferred embodiment, the composition of the capacitor dielectric is a tantalum penta-oxide $Ta_2O_5$ or titanium dioxide $TiO_2$ layer. The tantalum penta-oxide $Ta_2O_5$ layer is chosen because the current through its controlled time and frequency dependent impedance of capacitors C1 61 and C2 62 is then greater than, and in the opposite direction of the associated transistor off current (in some cases $10^{-12}$ amperes) providing an RC time constant of about $10^{-3}$ seconds. This controlled time and frequency dependent impedance: 1) compensates for deleterious and slow to change leakage mechanisms found in all circuits, and 2) stabilizes the circuit against the high frequency or transient events that tend to upset circuits such as memories. However, the further the current leakage of the capacitor is from the optimized factor of about ten times the current leakage of the transistor used will have some impact on the circuit optimization.

An application of the present invention is illustrated in, but not limited to, the following example. In the 0.25 um silicon semiconductor technology, the current leakage of a metal oxide field effect transistor is about $1^{E-10}$ amperes per unit transistor. The use of a capacitor, as a load element, to offset such a transistor device current leakage requires a capacitor with a nominal current of $1^{E-9}$ amperes per load element. Capacitor currents for this type of device current leakage can be between $5^{E-10}$ and $2^{E-9}$ amperes per load element, and the overall circuit will behave in a similar manner.

Figure 6:
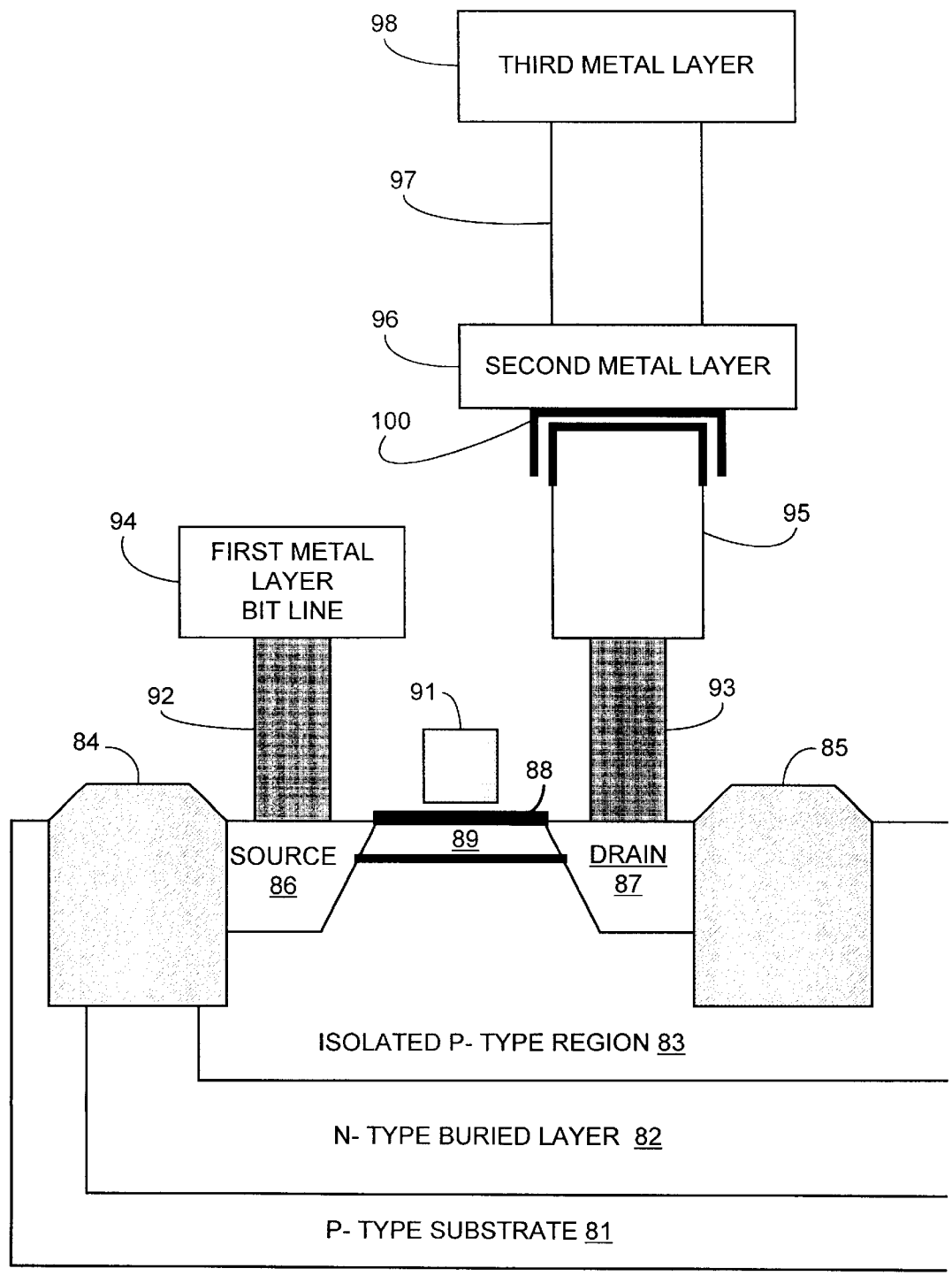
FIG. 6 shows a cross-section diagram of the integrated circuit component for the capacitor load and access transistor of a dynamic memory cell of the present invention.

Illustrated in FIG. 6 is the cross sectional diagram of the capacitor used in the memory cell of the present invention. The memory cell in FIG. 6 comprises a P-type substrate 81. The substrate 81 is preferably a silicon type substrate. An N-type layer 82 is formed on top of the P-type substrate 81 and an isolated P-type region 83 is then formed upon the N-type layer 82, thereby burying the N-type layer 82.

A field oxide dielectric layer 84 and 85 are formed on the P-type substrate 81, N-type buried layer 82 and the isolated P-type layer region 83. When voltage is applied, the source 86 and drain 87 components of the access transistor form a channel 89 within the isolated P-type region between the source 86 and drain 87. A gate electrode 91 is then deposited on top of the oxide 88 to form a MOSFET transistor with the source 86 and drain 87.

Contact 92 is used to connect the first metal layer BIT line 94 to the source 86. Contact 93, is used to connect the drain 87 to the tungsten cylinder 95. Contacts 92 and 93 can be self-aligned or non-self-aligned depending on the desired complexity of fabrication and circuit density. For higher circuit density, a self-aligned contact is preferred. For simple fabrication a non-self-aligning contact is preferred.

The tungsten cylinder 95 acts as a plug between leaky capacitor 100 of the present invention, and the contact 93. The tungsten cylinder 95 is utilized to provide for an expanded surface area for the capacitor 100 of the present invention, in order to maximized the capacitance and therefore the charge of the capacitor 100.

In an alternative embodiment, the sides of the tungsten cylinder 95 can be utilized as surface area for depositing the dielectric for the capacitor 100 of the present invention, thereby increasing the total surface area of the capacitor.

Positioned between the tungsten cylinder plug 95 and the second metal layer 96 is where the capacitor C1 61 or C2 62 of the present invention is formed. The method of fabricating a metal to metal capacitor on an integrated circuit is described in the commonly assigned U.S. Pat. No. 5,576,240, issued to Radosevich, et al., on Nov. 19, 1996, for "Method for Making a Metal to Metal Capacitor," and is herein incorporated by reference.

Tungsten cylinder plug 95 is utilized on top the contact 93 to expand the surface area for capacitor 100 as discussed above, which is situated between the second metal layer 96 and the contact 93. In an alternative embodiment, the sides of the second metal layer 96 can be drawn down and around the sides of the tungsten cylinder 95 utilized as surface area for the dielectric for the capacitor 100 of the present invention, thereby further increasing the total surface area of the capacitor.

On top of second metal layer 96 is a second tungsten cylinder plug 97. Both tungsten cylinder plug 95 and tungsten cylinder plug 97 are fabricated first by using selective reactive ion etching and conventional photolithography techniques. Next, a glue/barrier layer is deposited on the surface. Then, a combination of a chemical vapor deposition and chemical mechanical polishing is used to form the tungsten cylinder plug 95 and 97, respectively.

A standard multi-level metal interconnection scheme is deployed to complete the interconnection of the integrated circuit (i.e. connecting the memory sections to the logic sections) to form an embedded configuration.

The foregoing description has been presented for purposes of illustration and description. It is not intended to be exhaustive or to limit the invention to the precise forms disclosed. Obvious modifications or variations are possible in light of the above teachings.

The embodiment or embodiments discussed are chosen and described to provide a good illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A static memory cell apparatus comprising:
   at least one transistor; and
   at least one capacitor electrically connected to said transistor to act as a load element for said memory cell, wherein the current flows through said at least one capacitor to the memory cell, and wherein said at least one capacitor further comprises a dielectric selected from the group consisting of tantalum pentoxide and titanium dioxide.

2. The apparatus of claim 1, wherein said at least one capacitor further comprises:
   a dielectric with a controlled time and frequency dependent impedance, wherein said dielectric is controlled by utilizing an optimal surface area and thickness for said dielectric.

3. The apparatus of claim 1, wherein said capacitor is contructed around a top and sides of a plug.

4. The apparatus of claim 3, wherein said plug is constructed with tungsten.

5. A static memory cell apparatus comprising:
   a means for storing a bit of information; and
   a means for providing a capacitor load element for said static memory cell, wherein said capacitor load element means further comprises a capacitor having a dielectric selected from the group consisting of tantalum pentoxide and titanium dioxide.

6. The apparatus of claim 5, wherein said dielectric further comprises:
   a controlled time and frequency dependent impedance, wherein said dielectric is controlled by utilizing an optimal surface area and thickness for said dielectric.

7. The apparatus of claim 5, wherein said capacitor further comprises:
   a plug having a top and sides, wherein said capacitor is formed around said top and said sides of said plug.

8. The apparatus of claim 7, wherein said plug is constructed with tungsten.

9. A memory cell apparatus comprising:
   a storage element for storing a bit of information; and
   a capacitor load element for said storage element, wherein said capacitor load element further comprises a dielectric selected from the group consisting of tantalum pentoxide and titanium dioxide.

10. The apparatus of claim 9, wherein said capacitor load element further comprises:
    a dielectric with a controlled time and frequency dependent impedance, wherein said dielectric is controlled by utilizing an optimal surface area and thickness for said dielectric.

11. The apparatus of claim 10, wherein said capacitor load element further comprises:
    a plug having a top and sides, wherein said capacitor is constructed around said top and said sides of said plug.

12. The apparatus of claim 11, wherein said plug is constructed with tungsten.

13. A static memory cell apparatus comprising:

first and second bit lines;

a first transistor, said first transistor connected to said first bit line on a first transistor first contact;

a second transistor, said second transistor electrically connected to said second bit line on a second transistor first contact;

a first capacitor, said first capacitor electrically connected to a source current on a first capacitor first contact;

a second capacitors, said second capacitor electrically connected to said source current on a second capacitor first contact;

a third transistor, said third transistor electrically connected to a ground contact on a third transistor first contact, a second contact of said third transistor being electrically connected to a second contact of said first capacitor;

a fourth transistor, said fourth transistor electrically connected to a ground contact on a fourth transistor first contact, a second contact of said fourth transistor being electrically connected to a second contact of said second capacitor;

wherein a second contact of said first transistor is electrically connected to said third transistor second contact and a fourth transistor third contact;

wherein a second contact of said second transistor is electrically connected to said fourth transistor second contact and a third transistor third contact, and wherein said first capacitor and second capacitor comprise a dielectric selected from the group consisting of tantalum pentoxide and titanium dioxide.

14. The apparatus of claim 13, wherein said first and said second capacitors further comprises:

a plug having a top and sides, wherein said first and said second capacitors are constructed around said top and said sides of said plug.

15. The apparatus of claim 14, wherein said plug is constructed with tungsten.

16. A method for forming a static memory cell apparatus, comprising the steps of:

providing a substrate;

forming a source contact on said substrate, wherein said source contact a comprises field oxide dielectric layer;

forming a drain contact on said substrate, wherein said drain contact comprises a field oxide dielectric layer;

forming a gate electrode on top of said field oxide to form a transistor;

forming a first contact on said source contact;

forming a first metal layer BIT line on said first contact to connect said contact to said first metal layer BIT line;

forming a second contact on said drain contact;

fabricating a first tungsten plug on said second contact;

forming a capacitor on said first tungsten plug, said capacitor including a dielectric with a current drain characteristic that is in the range of 5 to 20 times that of the transistor current drain characteristics in an off condition;

forming a second metal layer on said capacitor;

fabricating a second tungsten plug on said second metal layer; and forming a third metal layer on said second tungsten plug.

17. The method of claim 16, wherein said dielectric is selected from the group consisting of tantalum pentoxide and titanium dioxide.

18. The method of claim 16, wherein the step of forming a capacitor on said first tungsten plug further comprises:

drawing said capacitor around a top and sides of said first tungsten plug.

* * * * *